United States Patent
Ryu et al.

(10) Patent No.: US 8,399,905 B2
(45) Date of Patent: Mar. 19, 2013

(54) FLAT PANEL DISPLAY APPARATUS

(75) Inventors: Ji-Hun Ryu, Yongin (KR); Sun-Young Jung, Yongin (KR); Seung-Yong Song, Yongin (KR); Young-Seo Choi, Yongin (KR); Oh-June Kwon, Yongin (KR); Kwan-Hee Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 129 days.

(21) Appl. No.: 12/512,912

(22) Filed: Jul. 30, 2009

(65) Prior Publication Data
US 2010/0123142 A1    May 20, 2010

(30) Foreign Application Priority Data
Nov. 18, 2008   (KR) .................. 10-2008-0114747

(51) Int. Cl.
*H01L 33/00* (2010.01)

(52) U.S. Cl. .............. 257/100; 257/E33.059; 438/26; 313/509

(58) Field of Classification Search .................. 257/100, 257/E33.059; 438/26; 313/509
See application file for complete search history.

(56) References Cited

U.S. PATENT DOCUMENTS

| | | | |
|---|---|---|---|
| 6,998,776 B2 * | 2/2006 | Aitken et al. | 313/512 |
| 2004/0251827 A1 * | 12/2004 | Kang et al. | 313/512 |
| 2008/0206925 A1 * | 8/2008 | Chatterjee et al. | 438/106 |

FOREIGN PATENT DOCUMENTS

WO    WO 2008/103338 A1    8/2008

* cited by examiner

*Primary Examiner* — Steven J Fulk
(74) *Attorney, Agent, or Firm* — Knobbe Martens Olson & Bear LLP

(57) ABSTRACT

Provided is a flat panel display apparatus including a sealant which has a small effective width and is able to effectively attach a substrate and an encapsulation substrate. The flat panel display apparatus includes the substrate, a display unit disposed on the substrate, the encapsulation substrate disposed facing the substrate so that the display unit is disposed on inner side of the encapsulation substrate, and the sealant attaching the substrate and the encapsulation substrate, wherein an end surface of the sealant facing the substrate contacts a silicon oxide layer disposed on the substrate.

12 Claims, 5 Drawing Sheets

FLAT PANEL DISPLAY APPARATUS

CROSS-REFERENCE TO RELATED PATENT APPLICATION

This application claims the benefit of Korean Patent Application No. 10-2008-0114747, filed on Nov. 18, 2008, in the Korean Intellectual Property Office, the disclosure of which is incorporated herein in its entirety by reference.

BACKGROUND OF THE INVENTION

1. Field of the Invention

The present embodiments relate to a flat panel display apparatus, and more particularly, to a flat panel display apparatus including a sealant that has a small effective width and is able to effectively attach a substrate and an encapsulation substrate.

2. Description of the Related Art

In some flat panel display apparatuses, a substrate including a display unit and an encapsulation substrate covering the display unit are attached to each other by using a sealant. Such a sealant is generally disposed outside the display unit, covering the display unit.

FIG. 1 is a photograph showing bubbles A formed inside a sealant of a conventional flat panel display apparatus, and FIG. 2 is another photograph showing bubbles formed inside the sealant of the conventional flat panel display apparatus. In detail, FIGS. 1 and 2 are photographs when a silicon nitride layer is disposed on a substrate including a display unit and a sealant is disposed between the silicon nitride layer and a rear substrate. In such a conventional flat panel display apparatus, sizes of the bubbles A formed in the sealant reach up to 10 μm, and thus attachment of a substrate and the rear substrate may be weak. Strength of the sealant where the bubbles A are formed is weak, and thus the hardness of the sealant attaching the substrate and the rear substrate may deteriorate. Also, the bubbles A are generated in the sealant while coating and hardening the sealant, and thus a width of the hardened sealant is remarkably larger than a width of the sealant first coated due to the generation of the bubbles A. In FIG. 2, a width of the sealant that is hardened reaches up to approximately 600 μm due to the bubbles.

SUMMARY OF THE INVENTION

The present embodiments provide a flat panel display apparatus including a sealant that has a small effective width and is able to effectively attach a substrate and an encapsulation substrate. As one of skill in the art would realize, when an element is referred to as being "on" another element, it can be directly on the element or it can be indirectly on the element with one or more intervening elements interposed therebetween. Also, when an element is referred to as being "connected to" another element, it can be directly connected to the element or it can be indirectly connected to the element with one or more intervening elements interposed therebetween.

According to an aspect of the present embodiments, there is provided a flat panel display apparatus including: a substrate; a display unit disposed on the substrate; an encapsulation substrate disposed to face the substrate so that the display unit is interposed between the substrate and the encapsulation substrate; and a sealant attaching the substrate and the encapsulation substrate, wherein an end surface of the sealant facing the substrate contacts a silicon oxide layer disposed on the substrate.

An end surface of the sealant facing the encapsulation substrate may contact a surface of the encapsulation substrate facing the substrate.

The sealant may include bismuth.

The sealant may be melted by irradiating a laser beam and then hardened.

A bubble may not exist inside the sealant.

The silicon oxide layer may be extended from inside the display unit to outside the display unit.

A silicon nitride layer may be disposed between the silicon oxide layer and the substrate.

The sealant may not contact the silicon nitride layer.

A thickness of the silicon oxide layer may be 2000 Å or above.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

Hereinafter, the present embodiments will be described more fully with reference to the accompanying drawings, in which exemplary embodiments are shown.

Figure 3:
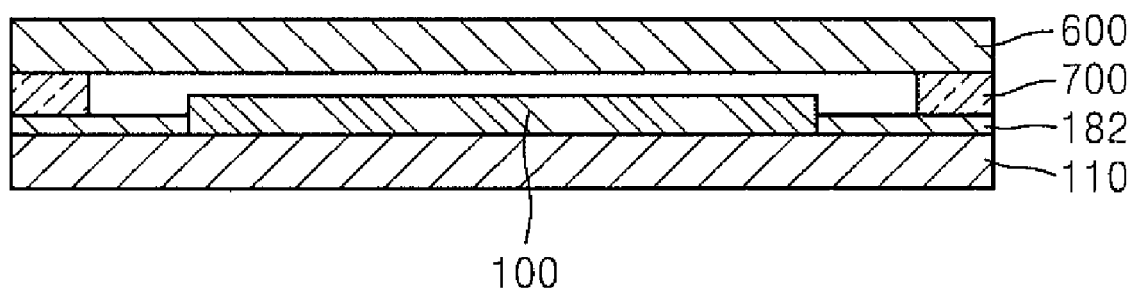
FIG. 3 is a cross-sectional view schematically illustrating a flat panel display apparatus, according to an embodiment.

FIG. 3 is a cross-sectional view schematically illustrating a flat panel display apparatus, according to an embodiment.

Referring to FIG. 3, the flat panel display apparatus includes a substrate 110, a display unit 100, an encapsulation substrate 600, and a sealant 700. The substrate 110 may be formed of various materials, such as a glass material, a metal material, or a plastic material etc. The display unit 100 is disposed on the substrate 110, and may include various display devices. For example, when the flat panel display apparatus of FIG. 3 is an organic light emitting display apparatus, the display unit 100 may include an organic light emitting device as a display device. The encapsulation substrate 600 is disposed to face the substrate 110, and, the encapsulation substrate 600 is disposed to face the substrate 110 so that the display unit 100 is interposed between the substrate 110 and the encapsulation substrate 600. The encapsulation substrate 600 may also be formed of various materials, such as a glass material, a metal material, and a plastic material etc. The sealant 700 attaches the substrate 110 and the encapsulation substrate 600 disposed as above. Here, an end surface of the sealant 700 facing the substrate 110 contacts a silicon oxide layer 182 disposed on the substrate 110. An end surface of the sealant 700 facing the encapsulation substrate 600 contacts a surface of the encapsulation substrate 600 facing the substrate 110. The silicon oxide layer 182 may be extended from inside the display unit 100 to outside the display unit 100. Details thereof will be described later.

As described above, a sealant is disposed between a silicon nitride layer and a rear substrate, and thus an end surface of the sealant facing a substrate contacts the silicon nitride layer disposed on the substrate. Here, while hardening the sealant, sizes of bubbles formed in the sealant reach up to 10 μm, and thus attachment between the substrate and the rear substrate by using the sealant may be weak. Also, a plurality of bubbles are generated in the sealant while coating and hardening the sealant. Due to the generation of the bubbles, a width of the sealant that is finally hardened is remarkably bigger than a width of the sealant that is first coated.

While not wishing to be bound to a particular theory, one reason that the bubbles are generated in the sealant is related to a process of manufacturing the silicon nitride layer below the sealant. The silicon nitride layer is formed by synthesizing $SiH_4$ and $NH_3$ in gas statuses, and here, $SiN_2$ and/or $SiNH$ is formed. The sealant is melted and then hardened with a laser beam, and thus when the laser beam is directed to the sealant so as to harden the sealant, $H_2$ is evaporated thereby forming the bubbles in the sealant. This is because the evaporated $H_2$ may penetrate into the sealant that has fluidity, while the sealant is melted.

Accordingly unlike a conventional flat panel display apparatus, in the flat panel display apparatus according to the current embodiment, the end surface of the sealant 700 facing the substrate 110 contacts the silicon oxide layer 182 instead of the silicon nitride layer. Here, a reaction like the silicon nitride layer is not generated while using a laser beam to harden the sealant 700 after coating the sealant 700. Accordingly, bubbles are prevented from being generated in the sealant 700, and the final width of the sealant 700 is thinner than that of a conventional sealant.

Figure 4:
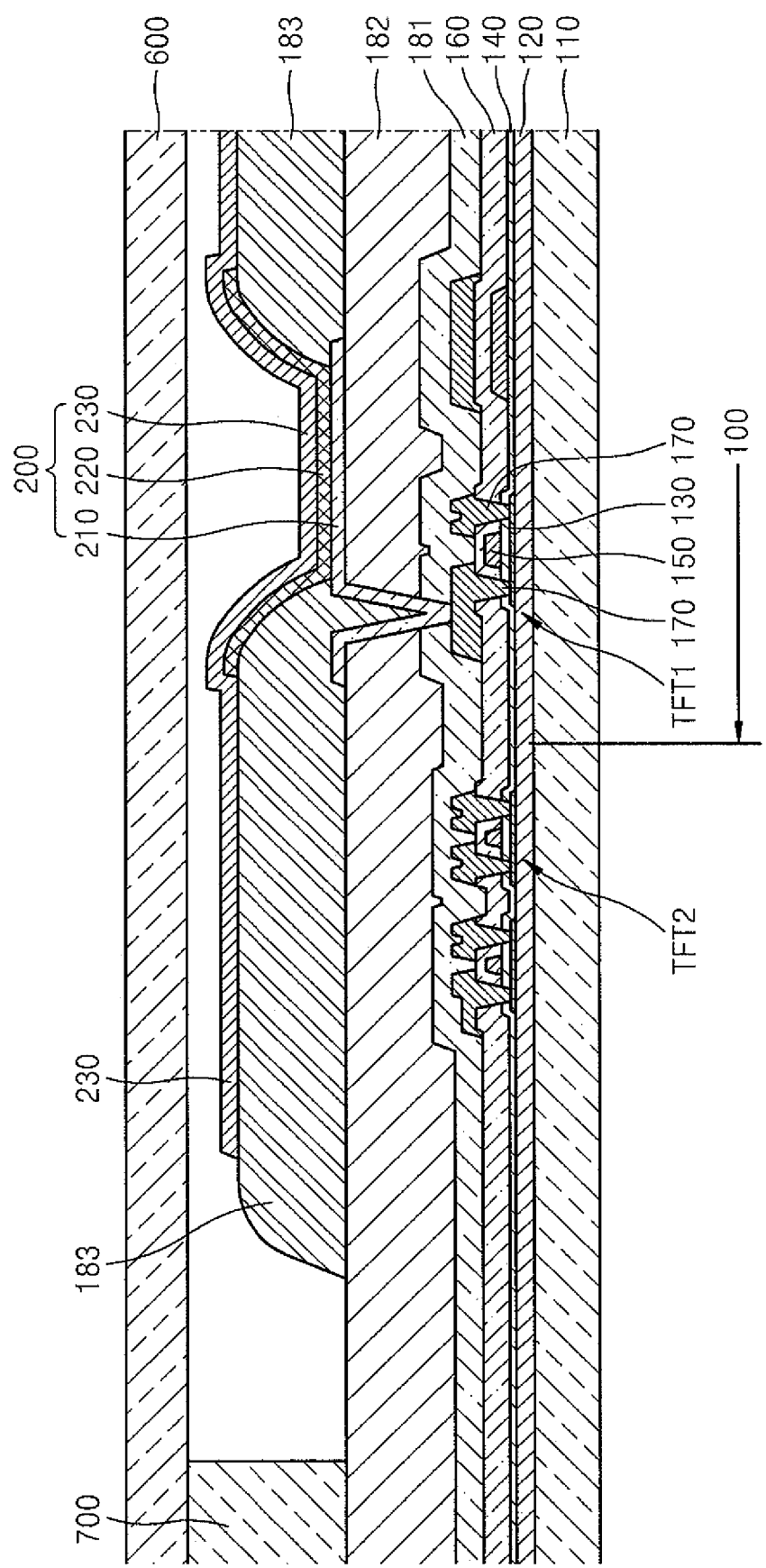
FIG. 4 is a cross-sectional view schematically illustrating an enlarged portion of the flat panel display apparatus of FIG. 3.

FIG. 4 is a cross-sectional view schematically illustrating an enlarged portion of the flat panel display apparatus of FIG. 3, a cross-sectional view of an edge of an organic light emitting display apparatus. Referring to FIG. 4, the display unit 100 includes an organic light emitting device 200, which includes a pixel electrode 210, a facing electrode 230 facing the pixel electrode 210, and an intermediate layer 220 including at least a light emitting layer disposed between the pixel electrode 210 and the facing electrode 230. Various circuit units, for example, a circuit unit including a thin film transistor TFT2, may be disposed outside the display unit 100 on the substrate 110, beside the organic light emitting device 200 of the display unit 100. Also, the sealant 700 is disposed on the edge of the substrate 110, so that the encapsulation substrate 600 covers the display unit 100.

Structures of the display unit 100 and the organic light emitting device 200 will now be described in detail.

A thin film transistor TFT1 is disposed in the display unit 100 on the substrate 110. The thin film transistor TFT1 includes source/drain electrodes 170, a semiconductor layer 130, and a gate electrode 150. A gate dielectric layer 140 is disposed between the gate electrode 150 and the semiconductor layer 130 so as to isolate the semiconductor later 130 from the gate electrode 150, and an interlayer dielectric layer 160 is disposed between the gate electrode 150 and the source/drain electrodes 170 so as to isolate the source/drain electrodes 170 from the gate electrode 150. A buffer layer 120, formed of such as $SiO_2$, may be disposed between the thin film transistor TFT1 and the substrate 110.

A first dielectric layer 181, which is a passivation layer, is disposed on the thin film transistor TFT1 so as to protect the thin film transistor TFT1. The first dielectric layer 181 may be formed of various materials, such as an inorganic matter like silicon nitride or silicon oxynitride, which has excellent performance of protecting the thin film transistor TFT1. As illustrated in FIG. 4, such a first dielectric layer 181 may not only be formed on the display unit 100 but may also be extended to outside the display unit 100. Accordingly, when the sealant 700 contacts the first dielectric layer 181, bubbles may be formed in the sealant 700 as described above while hardening the sealant 700. Consequently, in the organic light emitting display apparatus according to the current embodiment, a second dielectric layer 182 formed of silicon oxide is formed on the first dielectric layer 181. Ultimately, a silicon nitride layer (the first dielectric layer 181) is disposed below a silicon oxide layer (the second dielectric layer 182) facing the substrate 110. Accordingly, the sealant 700 contacts the second dielectric layer 182 formed of silicon oxide instead of the first dielectric layer 181 formed of silicon nitride, and thus a plurality of big bubbles are effectively prevented from being generated in the sealant 700. In the structure as illustrated in FIG. 4, when a laser beam is used to harden the sealant 700, the laser beam may be used on the first dielectric layer 181 besides the sealant 700 and the second dielectric layer 181. In this case, $H_2$ may be evaporated in the first dielectric layer 181, and thus a thickness of the second dielectric layer 182 may be formed to at least about 2000 Å, so that the evaporated $H_2$ does not move to the sealant 700. When the thickness of the second dielectric layer 182 is at least about 2000 Å, 112 that is evaporated in the first dielectric layer 181 due to the laser beam does not pass through the second dielectric layer 182.

The organic light emitting device 200 including the pixel electrode 210, the intermediate layer 220, and the facing electrode 230, which are sequentially stacked, is disposed on the second dielectric layer 182. This will now be described in detail.

An opening exposing at least one of the source/drain electrodes 170 of the thin film transistor TFT1 is formed in the first dielectric layer 181 and the second dielectric layer 182, and the pixel electrode, which is electrically connected to the thin film transistor TFT1 by contacting any one of the source/drain electrodes 170 via the opening, is disposed on the display unit 100 of the substrate 110 such as on the second dielectric layer 182. The pixel electrode 210 may be a transparent electrode or a reflective electrode. When the pixel electrode 210 is a transparent electrode, the pixel electrode 210 may be formed of ITO, IZO, ZnO, or $In_2O_3$, for example. When the pixel electrode 210 is a reflective electrode, the pixel electrode 210 may include a reflective layer formed of Ag, Mg, Al, Pt, Pd, Au, Ni, Nd, Ir, Cr, or a mixture thereof for example and a layer formed of ITO, IZO, ZnO, or $In_2O_3$, for example. However, a material of the pixel electrode 210 is not limited thereto, and a structure of the pixel electrode 210 is not limited thereto, and may be a single layer or multi layer.

A third dielectric layer 183 is disposed on the second dielectric layer 182. In some embodiments, the third dielectric layer 183 is formed to cover the second dielectric layer 182. The third dielectric layer 183 is a pixel defining layer that defines a pixel by including an opening corresponding to each sub-pixel, such as an opening that exposes at least a portion, for example, a center portion, of the pixel electrode 210 or the entire pixel electrode 210. Also as illustrated in FIG. 4, the third dielectric layer 183 increases a distance between an end portion of the pixel electrode 210 and the facing electrode 230, thereby preventing an arc, or the like, from generated in the end portion of the pixel electrode 210.

The intermediate layer 220 of the organic light emitting device 200 may be formed of a low molecular or high molecular material. When the intermediate layer 220 is formed of a low molecular material, a hole injection layer, a hole transport layer, an emission layer, an electron transport layer, and an electron injection layer may be stacked in a single or multi structure. Also, the intermediate layer 220 may be formed of various materials including, for example, copper phthalocyanine (CuPc), (N,N'-Di(naphthalene-1-yl)-N,N'-diphenyl-benzidine (NPB), and tris-8-hydroxyquinoline aluminum (Alq3). The intermediate layer 220 may be formed via a vacuum deposition method, for example.

When the intermediate layer 220 is formed of a high molecular material, the intermediate layer 220 can include a hole transport layer and an emission layer. Here, PEDOT (Poly(3,4-ethylenedioxythiophene)-poly(styrenesulfonate) can be used as the hole transport layer and a poly-phenylenevinylene (PPV) based or polyfluorene based high molecular material is used as the emission layer. The intermediate layer 220 may be formed via a screen printing or inkjet printing method. However, a structure of the intermediate layer 220 is not limited thereto.

The facing electrode 230 is disposed on the intermediate layer 220, i.e. on the display unit 100. As illustrated in FIG. 4, the facing electrode 230 may be disposed to cover the display unit 100. The facing electrode 230 may be a transparent electrode or a reflective electrode. When the facing electrode 230 is a transparent electrode, the facing electrode 230 may include a layer formed of a metal having a low work function, such as, for example, Li, Ca, LiF/Ca, LiF/Al, Al, Ag, Mg, or a mixture thereof, and a transparent conductive layer formed of, for example, ITO, IZO, ZnO, or $In_2O_3$. When the facing electrode 230 is a reflective electrode, the facing electrode 230 may be formed of, for example, Li, Ca, LiF/Ca, LiF/Al, Al, Ag, Mg, or a mixture thereof However, a structure and a material of the facing electrode 230 are not limited thereto.

Figure 1:
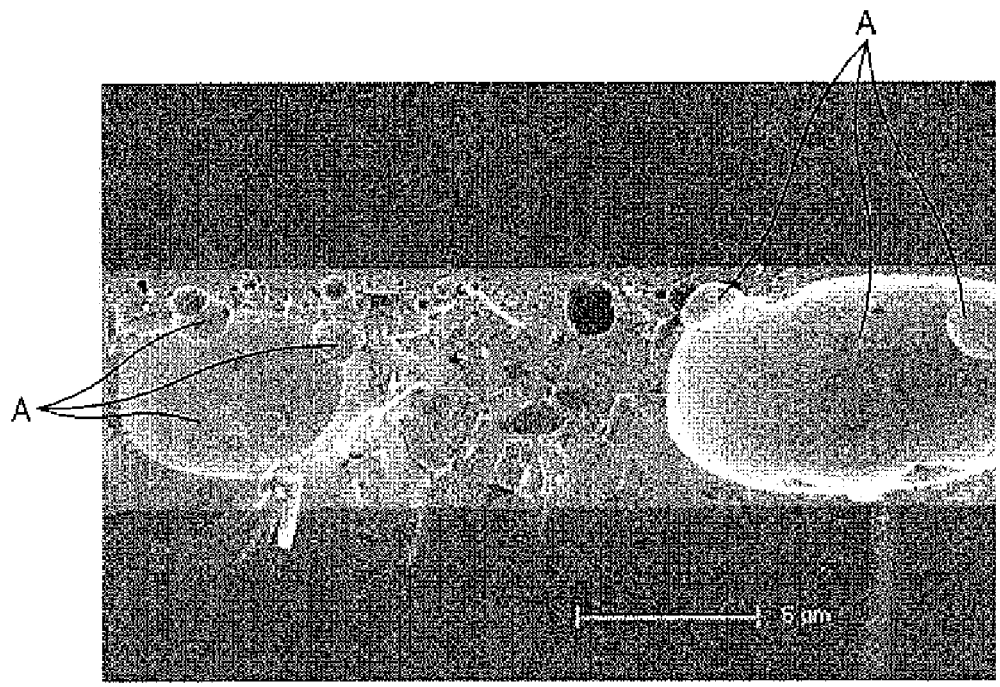
FIG. 1 is a photograph showing bubbles formed inside a sealant of a conventional flat panel display apparatus.
Figure 5:
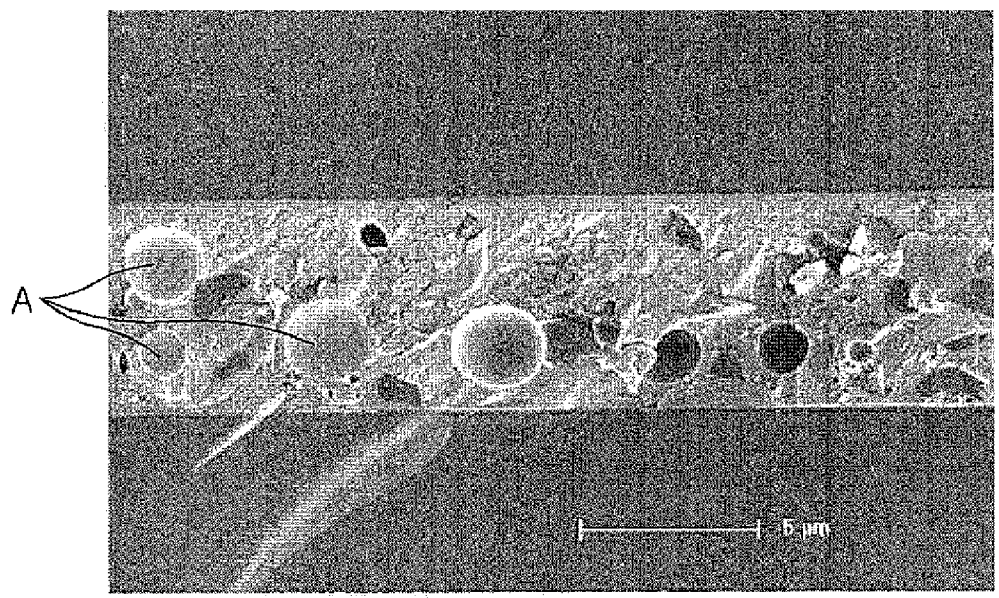
FIG. 5 is a photograph illustrating bubbles formed inside a sealant of the flat panel display apparatus of FIG. 3.
Figure 6:
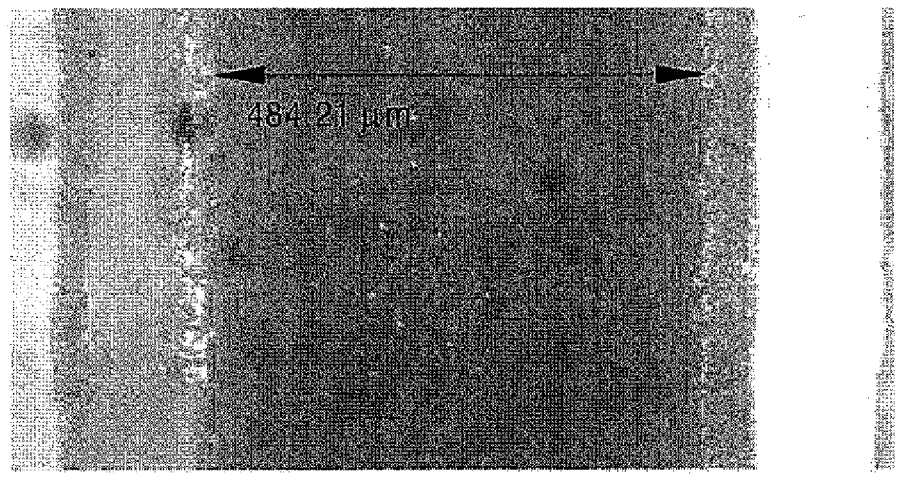
FIG. 6 is another photograph illustrating bubbles formed inside the sealant of the flat panel display apparatus of FIG. 3.

FIG. 5 is a photograph illustrating bubbles formed inside a sealant of the flat panel display apparatus of FIG. 3, and FIG. 6 is another photograph illustrating bubbles formed inside the sealant of the flat panel display apparatus of FIG. 3. Comparing FIG. 5 and FIG. 1 that shows the bubbles formed in the sealant of the conventional flat panel display apparatus, the diameters of the bubbles formed in FIG. 1 reach up to about 10 µm, but diameters of the bubbles formed in FIG. 5 reach up to about 3 µm or lower. Accordingly, attachment between a substrate and a rear substrate is effectively increased.

Figure 2:
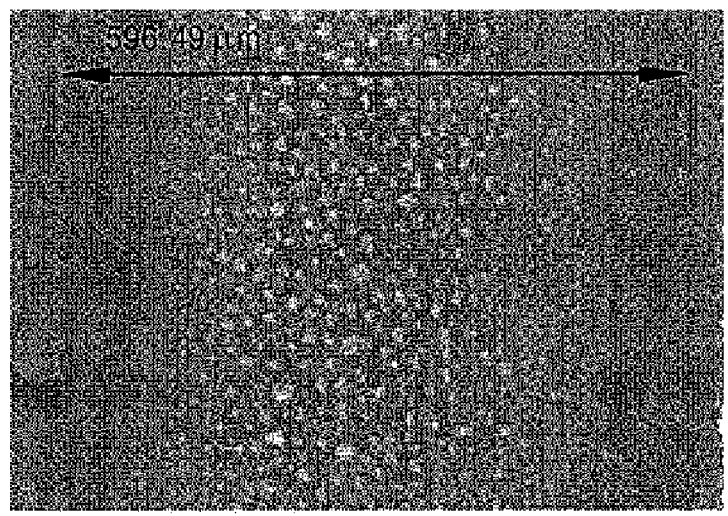
FIG. 2 is another photograph showing bubbles formed inside a sealant of a conventional flat panel display apparatus.

Comparing FIG. 6 and FIG. 2 that shows the bubbles formed in the sealant of the conventional flat panel display apparatus, not only the diameter but also the number of bubbles formed in the sealant of the flat panel display apparatus according to the current embodiment are remarkably reduced. Accordingly, even when a width of the sealant first applied while manufacturing the conventional flat panel display apparatus and a width of the sealant first applied while manufacturing the flat panel display apparatus according to the current embodiment are the same, a width of the sealant hardened on the conventional flat panel display apparatus reaches up to 600 µm, whereas a width of the sealant hardened on the flat panel display apparatus according to the current embodiment is below 500 µm. Accordingly, the width of the sealant on the flat panel display apparatus according to the current embodiment is smaller than that of the sealant on the conventional flat panel display apparatus, and the sealant is effectively prevented from being flowing into a display unit while hardening the sealant.

Figure 7:
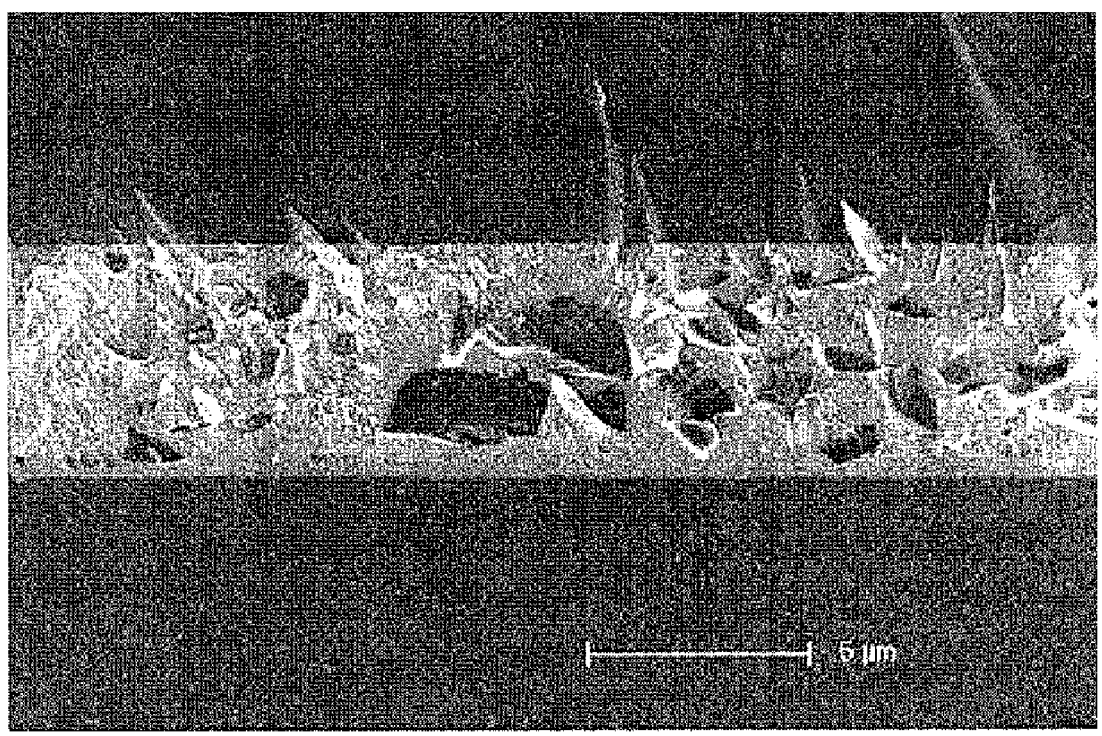
FIG. 7 is a photograph illustrating bubbles formed inside a sealant of a flat panel display apparatus according to another embodiment.

FIG. 7 is a photograph illustrating bubbles formed inside a sealant of a flat panel display apparatus according to another embodiment.

In FIG. 5, which shows the sealant in the flat panel display apparatus according to the previous embodiment, the sealant includes $V_2O_5$. In the flat panel display apparatus according to the previous embodiment, the sealant contacts a silicon oxide layer, but does not directly contact a silicon nitride layer, and thus bubbles are effectively prevented from being formed in the sealant by the silicon nitride layer. However even in this case, small bubbles may be generated as $O_2$ is evaporated from $V_2O_5$ included in the sealant.

In order to maximize attachment between a substrate and an encapsulation substrate by using a sealant, bubbles should be prevented from being formed. Accordingly, the sealant may include bismuth instead of $V_2O_5$. Here, as illustrated in FIG. 7, bubbles are not formed in the sealant. Of course, the sealant including bismuth contacts the silicon oxide layer but does not directly contact the silicon nitride layer. Accordingly, the attachment between the substrate and the encapsulation substrate is maximized.

As described above, the flat panel display apparatus including the sealant, which has a small effective width and effectively attaches the substrate and the encapsulation substrate, can be realized.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A flat panel display apparatus comprising:
   a substrate;
   a silicon oxide layer disposed on and contacting the substrate;
   a display unit disposed on the substrate;
   an encapsulation substrate disposed to face the substrate so that the display unit is interposed between the substrate and the encapsulation substrate; and
   a sealant attaching the substrate and the encapsulation substrate,
   wherein an end surface of the sealant facing the substrate contacts the silicon oxide layer disposed on the substrate;
   wherein the sealant is melted by a laser beam and then hardened; and
   wherein substantially no bubbles exist inside the sealant.

2. The flat panel display apparatus of claim 1, wherein an end surface of the sealant facing the encapsulation substrate contacts a surface of the encapsulation substrate facing the substrate.

3. The flat panel display apparatus of claim 1, wherein the sealant comprises bismuth.

4. The flat panel display apparatus of claim 1, wherein the sealant comprises $V_2O_5$.

5. The flat panel display apparatus of claim 1, wherein the silicon oxide layer is extended from inside the display unit to outside the display unit.

6. The flat panel display apparatus of claim 1, wherein a thickness of the silicon oxide layer is 2000 Å or above.

7. A flat panel display apparatus comprising:
   a substrate;
   a silicon oxide layer disposed on and contacting the substrate;
   a display unit disposed on the substrate;
   a source electrode;

a drain electrode;
a semiconductor layer;
a gate electrode;
at least one dielectric layer;
an encapsulation substrate disposed to face the substrate so that the display unit is interposed between the substrate and the encapsulation substrate; and
a sealant attaching the substrate and the encapsulation substrate,
wherein an end surface of the sealant facing the substrate contacts the silicon oxide layer disposed on the substrate;
wherein the sealant is melted by a laser beam and then hardened; and
wherein substantially no bubbles exist inside the sealant.

8. The flat panel display apparatus of claim 7, wherein an end surface of the sealant facing the encapsulation substrate contacts a surface of the encapsulation substrate facing the substrate.

9. The flat panel display apparatus of claim 7, wherein the sealant comprises bismuth.

10. The flat panel display apparatus of claim 7, wherein the sealant comprises $V_2O_5$.

11. The flat panel display apparatus of claim 7, wherein the silicon oxide layer is extended from inside the display unit to outside the display unit.

12. The flat panel display apparatus of claim 7, wherein a thickness of the silicon oxide layer is 2000 Å or above.

* * * * *